(12) United States Patent
Kim et al.

(10) Patent No.: US 6,593,603 B1
(45) Date of Patent: Jul. 15, 2003

(54) PSEUDOMORPHIC HIGH ELECTRON MOBILITY TRANSISTOR POWER DEVICE

(75) Inventors: Haecheon Kim, Daejon (KR); Min Park, Daejon (KR); Jae-kyoung Mun, Daejon (KR); Chang-hee Hyoung, Daejon (KR); Hong-gu Ji, Daejon (KR); Ho-kyun Ahn, Daejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/112,359

(22) Filed: Mar. 29, 2002

(30) Foreign Application Priority Data

Dec. 28, 2001 (KR) ........................................ 2001-86533

(51) Int. Cl.$^7$ ............................................. H01L 29/739
(52) U.S. Cl. ....................... 257/194; 257/194; 257/192; 438/172
(58) Field of Search ................................. 257/194, 103, 257/183, 192, 94, 195; 438/172

(56) References Cited

U.S. PATENT DOCUMENTS

| | | | |
|---|---|---|---|
| 5,729,030 A | * | 3/1998 | Yamamoto et al. ......... 257/103 |
| 5,811,844 A | * | 9/1998 | Kuo et al. ................... 257/194 |
| 6,294,801 B1 | * | 9/2001 | Inokuchi et al. ............. 257/192 |
| 6,307,221 B1 | * | 10/2001 | Danzilio ...................... 257/192 |
| 6,489,639 B1 | * | 12/2002 | Hoke et al. .................. 257/194 |

FOREIGN PATENT DOCUMENTS

| | | | |
|---|---|---|---|
| JP | 2000174260 | 6/2000 | ......... H01L/29/778 |
| JP | 2000269480 | 9/2000 | ......... H01L/29/778 |

OTHER PUBLICATIONS

IEEE, 1996, AlGaAs/InGaAs Power P–HEMTs for High–Efficiency, Low–Voltage Portable Applications, M.J. Martinez, et al., 3 pages.

* cited by examiner

*Primary Examiner*—David Nelms
*Assistant Examiner*—Thinh T. Nguyen
(74) *Attorney, Agent, or Firm*—Blakely, Sokoloff, Taylor & Zafman

(57) ABSTRACT

A pseudomorphic high electron mobility transistor (PHEMT) power device formed on a double planar doped epitaxial substrate and capable of operating with a single voltage source and a method for manufacturing the PHEMT power device are provided. The PHEMT power device includes: an epitaxial substrate including a GaAs buffer layer, an AlGaAs/GaAs superlattice layer, an updoped AlGaAs layer, a first doped silicon layer, a first spacer, an InGaAs electron transit layer, a second spacer, a second doped silicon layer having a different doping concentration from the first doped silicon layer, a lightly doped AlGaAs layer, and an undoped GaAs cap layer stacked sequentially on a semi-insulating GaAs substrate; a source electrode and a drain electrode formed on and in ohmic contact with the undoped GaAs cap layer; and a gate electrode formed on the lightly doped AlGaAs layer to extend through the undoped GaAs cap layer.

12 Claims, 11 Drawing Sheets

PSEUDOMORPHIC HIGH ELECTRON MOBILITY TRANSISTOR POWER DEVICE

BACKGROUND OF THE INVENTION

1. Field of the Invention

The present invention relates to a pseudomorphic high electron mobility transistor (PHEMT) power device and a method for manufacturing the same, and more particularly, to a PHEMT power device capable of operating with single voltage supply and a method for manufacturing the same.

2. Description of the Related Art

Recently, the demand for high frequency wireless communications, such as the bluetooth, wireless LAN and the like, tends to abruptly increase. This demand also has increased the need for a power device amplifying a signal to transmit a high radio-frequency (RF) signal. The recent trend to digital wireless communication related technology to increase simultaneous access capacity requires power devices having superior linearity.

Field effect transistors (FETs) for use in the manufacture of high RF power devices include metal-semiconductor field effect transistors (MESFETs), high electron mobility transistors (HEMTs) and the like. Common MESFET and HEMT require a negative pinch-off voltage, so a negative bias source is coupled to the gate for receiving an RF signal. However, the use of a circuit acting as the negative bias source increases the chip manufacturing costs, disadvantageously over heterojunction bipolar transistors using only a positive voltage source.

To drive a MESFET or HEMT device with a single voltage supply, the pinch-off voltage should be increased to apply a positive voltage of 0V or greater to the gate for receiving an RF signal. In this case, the maximum saturation current decreases whereas the leakage current increases, and thus it is unsuitable for power device applications. For a HEMT power device, the carrier concentration is purposely increased to increase the transconductance and thus the power gain. However, the final device has a lowered breakdown voltage and fails to ensure the transconductance consistent with respect to gate voltages, thereby reducing the linearity and power-added efficiency.

To manufacture a pseudomorphic high electron mobility transistor (PHEMT) power device that has excellent linearity and power-added efficiency and is capable of operating with a single voltage supply, the following requirements should be met: a pinch-off voltage (Vp) high enough to supply a positive operating voltage, a low knee voltage (Vk), a high breakdown voltage, a uniform transconductance with respect to gate voltages, a low source-gate capacitance and the like. However, all of these requirements cannot be met according to the electron transit layer structure and doping concentration. Therefore, there is a need to optimize the structure of an epitaxial substrate and device manufacturing conditions to manufacture a PHEMT power device that is capable of operating with a single voltage supply and has excellent linearity and high breakdown voltage.

SUMMARY OF THE INVENTION

It is a first objective of the present invention to provide a pseudomorphic high electron mobility transistor (PHEMT) power device that is capable of operating with a single voltage supply, has excellent linearity and a high breakdown voltage, is suitable for use in high-frequency digital wireless communications, and is inexpensive.

It is a second objective of the present invention to provide a method for manufacturing a PHEMT power device in which the structure and processing conditions of an epitaxial substrate are optimized to provide the PHEMT power device capable of operating with a single voltage supply and having excellent linearity and a high breakdown voltage.

To achieve the first objective of the present invention, there is provided a PHEMT power device comprising: an epitaxial substrate including a GaAs buffer layer, an AlGaAs/GaAs superlattice layer, an updoped AlGaAs layer, a first doped silicon layer, a first spacer, an InGaAs electron transit layer, a second spacer, a second doped silicon layer having a different doping concentration from the first doped silicon layer, a lightly doped AlGaAs layer, and an undoped GaAs cap layer stacked sequentially on a semi-insulating GaAs substrate; a source electrode and a drain electrode formed on and in ohmic contact with the undoped GaAs cap layer; and a gate electrode formed on the lightly doped AlGaAs layer to extend through the undoped GaAs cap layer.

It is preferable that each of the source electrode and the drain electrodes is formed of a AuGe/Ni/Au metal thin films.

It is preferable that the first doped silicon layer has a higher doping concentration than the second doped silicon layer. It is preferable that the first doped silicon layer has a doping concentration of $1.5 \times 10^{12}$–$2.5 \times 10^{12} cm^{-2}$, and the second doped silicon layer has a doping concentration of $0.7 \times 10^{12}$–$1.5 \times 10^{12} cm^{-2}$. More preferably, the doping concentration of the first doped silicon layer is twice that of the second doped silicon layer.

To improve lattice structure quality, it is preferable that the undoped AlGaAs layer contains aluminum of 0.3 or less by mole ratio.

It is preferable that the lightly doped AlGaAs layer has a doping concentration of $1.0 \times 10^{16}$–$1.0 \times 10^{17} cm^{-3}$. It is preferable that the undoped GaAs cap layer has a thickness of 1–100 nm. It is preferable that the InGaAs electron transit layer contains indium of 0.25 or less by mole ratio. It is preferable that the InGaAs electron transit layer has a thickness of 1–15 nm.

Preferably, the PHEMT power device further comprises a protective insulating layer formed on a portion of the undoped GaAs cap layer exposed by the source electrode, the drain electrode, and the gate electrode.

To achieve the second objective of the present invention, there is provided a method for manufacturing a PHEMT power device, comprising the steps of: sequentially stacking a GaAs buffer layer, an AlGaAs/GaAs superlattice layer, an updoped AlGaAs layer, a first doped silicon layer, a first spacer, an InGaAs electron transit layer, a second spacer, a second doped silicon layer having a different doping concentration from the first doped silicon layer, a lightly doped AlGaAs layer, and an undoped GaAs cap layer on a semi-insulating GaAs substrate; forming a source electrode and a drain electrode on and in ohmic contact with the undoped GaAs cap layer by forming a metal thin film on the undoped GaAs cap layer; forming a protective insulating layer on an exposed surface of the undoped GaAs cap layer; and defining a gate region exposing a portion of the undoped GaAs cap layer by removing a portion of the protective insulting layer; exposing a portion of the lightly doped AlGaAs layer by recess etching the exposed portion of the undoped GaAs cap layer in the gate region; and forming a gate electrode on the exposed portion of the lightly doped AlGaAs layer.

It is preferable that the PHEMT power device manufacturing method further comprises forming a photoresist pattern having an opening of a larger width than the gate electrode to be formed in the defined gate region to recess etch the undoped GaAs cap layer.

It is preferable that the PHEMT power device manufacturing method further comprises heat treating the source electrode and the drain electrode by rapid thermal annealing after the step of forming the source electrode and the drain electrode.

In the PHEMT power device according to the present invention, the structure of the epitaxial substrate, i.e., the doping concentration and thickness of a donor layer, is optimized to maintain the transconductance constant with respect to gate voltages. The PHEMT power device according to the present invention is capable of operating with a single voltage supply, without need to apply a negative bias voltage, and has a high breakdown voltage, excellent linearity and power-added efficiency.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Figure 1:
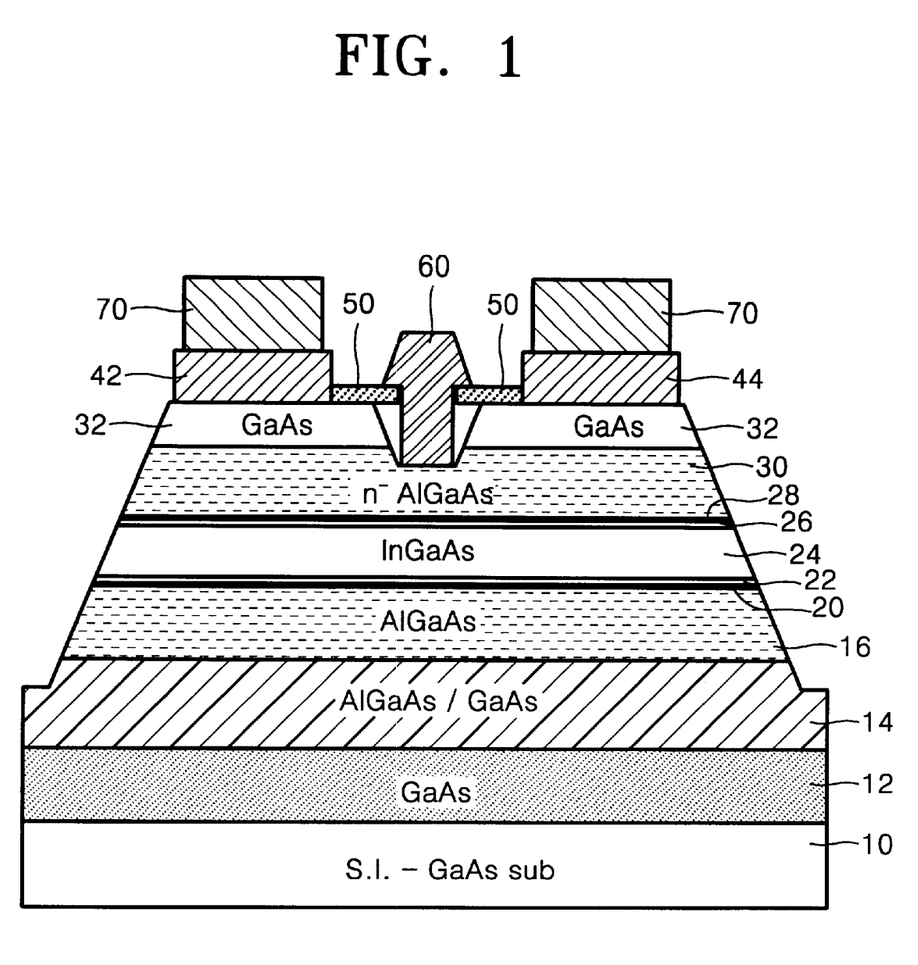
FIG. 1 is a sectional view showing the major structure of a preferred embodiment of a pseudomorphic high electron mobility transistor (PHEMT) power device according to the present invention.

Referring to FIG. 1, which is a sectional view illustrating the structure of a preferred embodiment of a pseudomorphic high electron mobility transistor (PHEMT) power device according to the present invention, the PHEMT power device includes an epitaxial substrate including a GaAs buffer layer 12, an AlGaAs/GaAs superlattice layer 14, an undoped AlGaAs layer 16 having a large bandgap, a first doped silicon layer 20, a first spacer 22, a InGaAs electron transit layer 24 having a narrow bandgap, a second spacer 26, a second doped silicon layer 28 with a different doping concentration from the first doped silicon layer 20, a lightly doped AlGaAs layer 30, and an updoped GaAs cap layer 32 sequentially stacked on a semi-insulating GaAs substrate 10.

The first doped silicon layer 20 has a higher doping concentration than the second doped silicon layer 28. For example, the first doped silicon layer 20 is formed to have a doping concentration of approximately $1.5 \times 10^{12}$–$2.5 \times 10^{12}$ cm$^{-2}$ and the second doped silicon layer 28 is formed to have a doping concentration of approximately $0.7 \times 10^{12}$–$1.5 \times 10^{12}$ cm$^{-2}$. It is preferable that the doping concentration of the first doped silicon layer 20 is twice that of the second doped silicon layer 28.

The undoped AlGaAs layer 16 contains aluminium (Al) of 0.3 or less by mole ratio. The InGaAs electron transit layer 24 contains indium (In) of 0.25 or less by mole ratio and has a thickness of approximately 1–15 nm.

It is preferable that the lightly doped AlGaAs layer 30 is formed to have a doping concentration of approximately $1.0 \times 10^{16}$–$1.0 \times 10^{17}$ cm$^{-3}$. The undoped GaAs cap layer 32 has a thickness of approximately 1–100 nm.

On the undoped GaAs cap layer 32 of the epitaxial substrate, a source electrode 42 and a drain electrode 44 are formed in ohmic contact with the undoped GaAs cap layer 32. The source electrode 42 and the drain electrode 44 are formed of AuGe/Ni/Au metal thin films.

A gate electrode 60 is formed on the lightly doped AlGaAs layer 30 to extend through the undoped GaAs cap layer 32. A protective insulating layer 50, for example, a silicon nitride layer, is formed on a portion of the undoped GaAs cap layer 32 exposed by the source electrode 42, the drain electrode 44, and the gate electrode 60.

In the double planar doped epitaxial substrate of the PHEMT power device according to the present invention having the structure as described above, the doping concentration of the lower first doped silicon layer 20 is greater than, preferably twice, the upper second doped silicon layer 28. As a result, the transconductance of the PHEMT power device becomes invariant to gate voltages.

The presence of the lightly doped AlGaAs layer 30 in the PHEMT power device according to the present invention ensures etching uniformity even in wet etching performed to form a recess in the manufacture of the PHEMT power device. Therefore, there is no need to apply dry etching which can induce damage by plasma. Also, the overall manufacturing process is simple and thus improves the productivity.

In addition, the breakdown voltage characteristic can be improved with the undoped GaAs cap layer 32.

FIGS. 2 through 8 are sectional views illustrating each step of a preferred embodiment of a method for fabricating the PHEMT power device according to the present invention.

Figure 2:
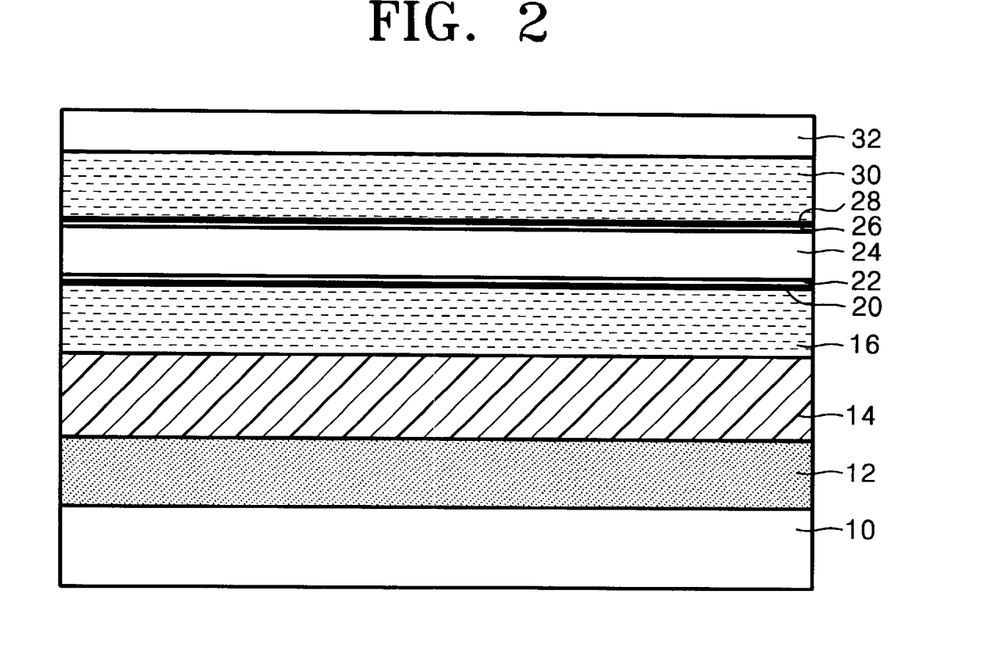
FIGS. 2 through 8 are sectional views illustrating each step of a method for manufacturing a PHEMT power device according to a preferred embodiment of the present invention.

Referring to FIG. 2, on a semi-insulating GaAs substrate 10, a GaAs buffer layer 12, a AlGaAs/GaAs superlattice layer 14, an updoped AlGaAs layer 16, a first doped silicon layer 20, a first spacer 22, an InGaAs electron transit layer 24, a second spacer 26, a second doped silicon layer 28 having a different doping concentration from the first doped silicon layer 20, a lightly doped AlGaAs layer 30, and an undoped GaAs cap layer 32 are sequentially grown to form an epitaxial substrate. The first doped silicon layer 20 is formed to have a doping concentration of approximately $1.5 \times 10^{12}$–$2.5 \times 10^{12}$ cm$^{-2}$, and the second doped silicon layer 28 is formed to have a doping concentration of approximately $0.7 \times 10^{12}$–$1.5 \times 10^{12}$ cm$^{-2}$. It is preferable that the doping concentration of the first doped silicon layer 20 is twice that of the second doped silicon layer 28.

The undoped AlGaAs layer 16 is formed to contain aluminium (Al) of 0.3 or less by mole ratio. The InGaAs electron transit layer 24 is formed to contain indium (In) of 0.25 or less by mole ratio and has a thickness of approximately 1–15 nm. The lightly doped AlGaAs layer 30 is formed to have a doping concentration of approximately $1.0 \times 10^{16}$–$1.0 \times 10^{17}$ cm$^{-3}$. The undoped GaAs cap layer 32 is formed to have a thickness of approximately 1–100 nm.

Figure 3:
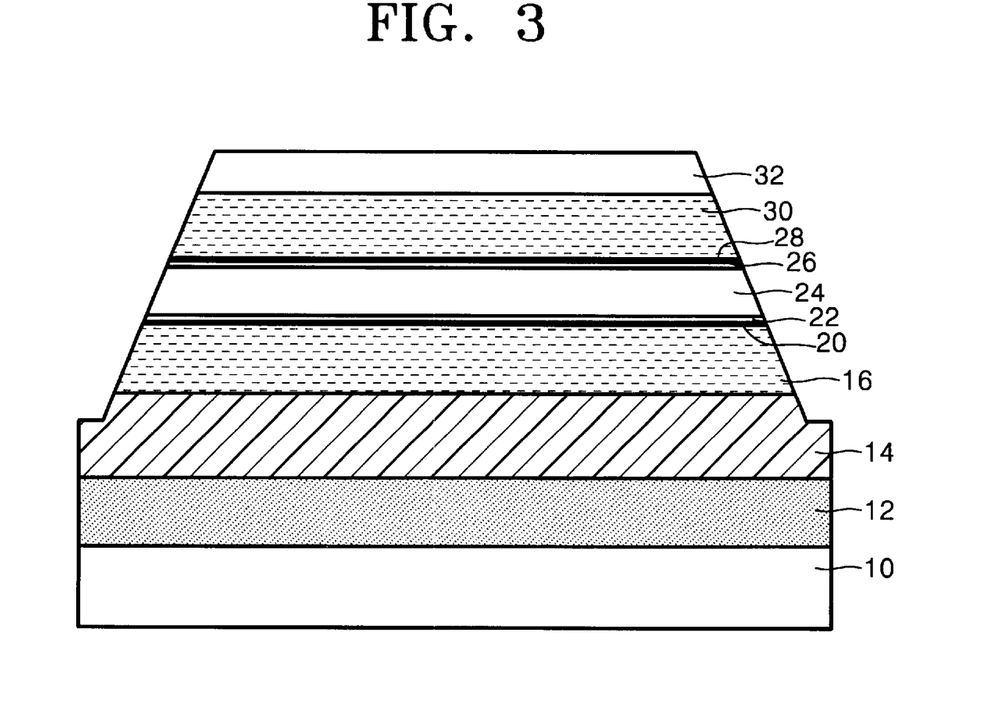

Referring to FIG. 3, the epitaxial substrate is mesa etched down to the AlGaAs/GaAs supperlattice layer 24 to separate individual devices.

Figure 4:
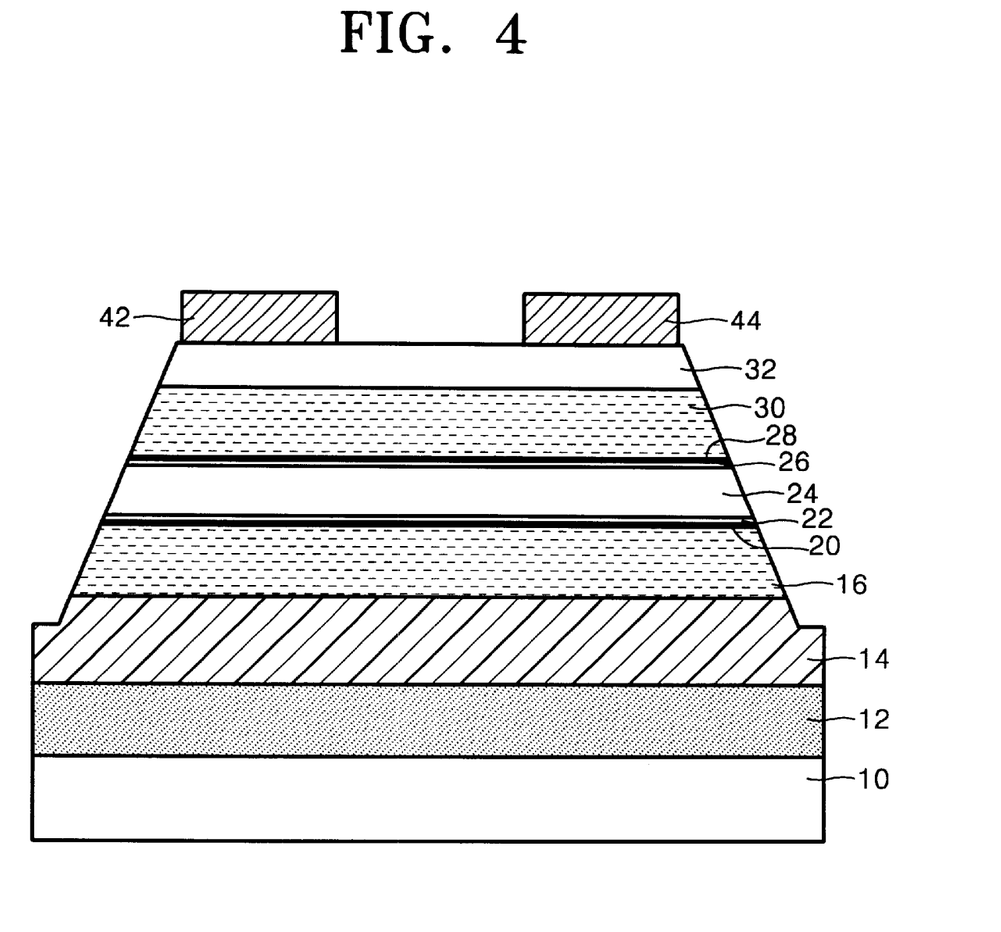

Referring to FIG. 4, a AuGe/Ni/Au metal thin film is formed on the undoped GaAs cap layer 32 and subjected to rapid thermal annealing (RTA) to form a source electrode 42 and a drain electrode 44 in ohmic contact with the undoped GaAs cap layer 32.

In a conventional PHEMT power device manufacturing method, a highly doped GaAs cap layer is commonly used to lower ohmic contact resistance. The present invention can form the source electrode 42 and the drain electrode 44 having a low contact resistance with the undoped GaAs cap layer 32 to increase the breakdown voltage and maintain the knee voltage low, thereby improving device power characteristics.

Figure 5:
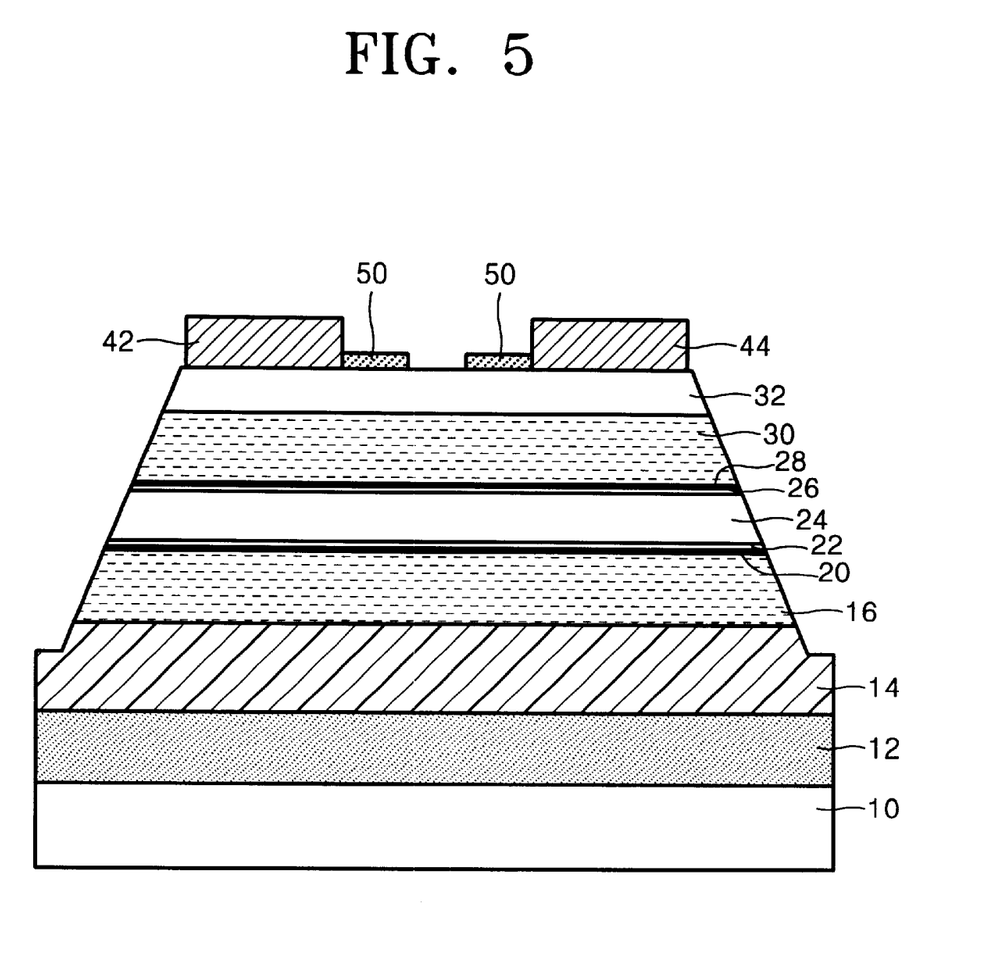

Referring to FIG. 5, after the ohmic contact has been formed, a protective insulating layer 50, for example, a silicon nitride layer, is formed to protect an exposed surface of the undoped GaAs cap layer 32. Next, a portion of the protective insulating layer 50 is removed to define a gate region exposing a portion of the undoped GaAs cap layer 32.

Figure 6:
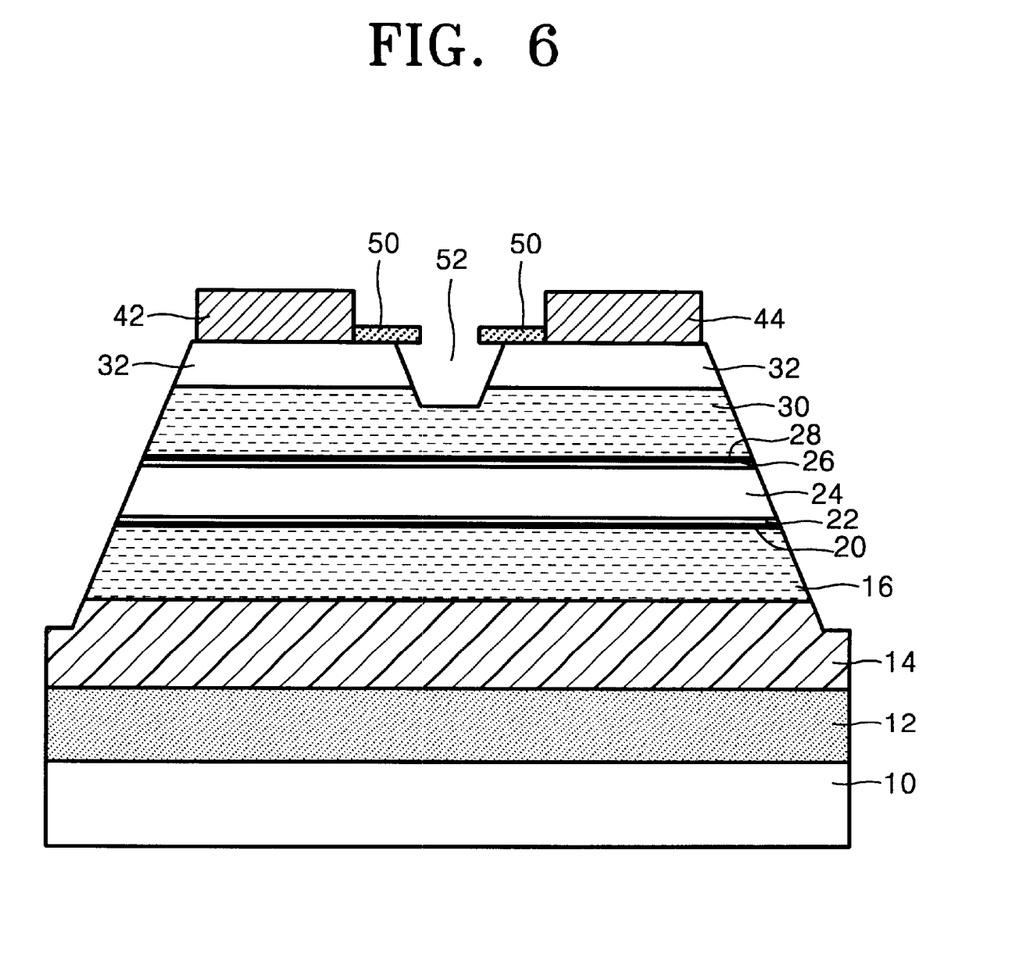

Referring to FIG. 6, the exposed portion of the undoped GaAs cap layer 32 is recess etched to form a recess region 52 exposing the lightly doped AlGaAs layer 30. Here, in recess etching the updoped GaAs cap layer 32, a photoresist pattern (not shown) having an opening of a larger width than a desired gate electrode to be formed in the defined gate region of the structure can be used.

Figure 7:
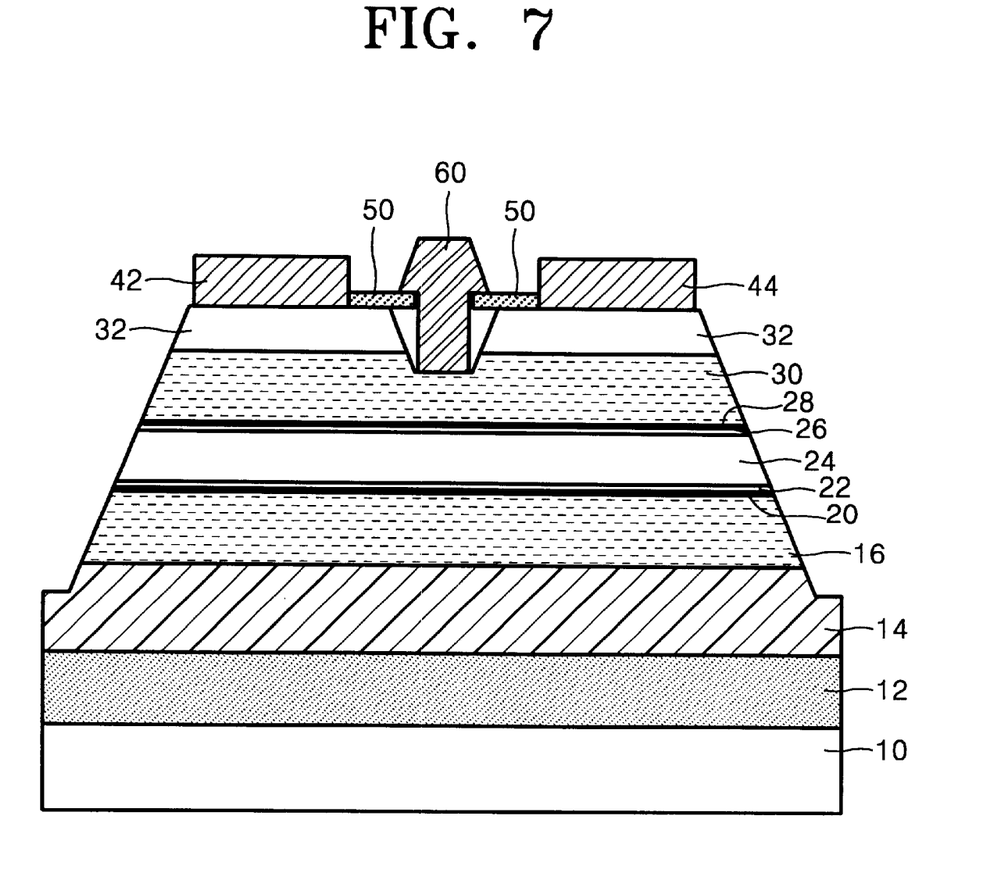

Referring to FIG. 7, a gate electrode 60 is formed on the exposed surface of the lightly doped AlGaAs layer 30, thereby resulting in a complete transistor.

Figure 8:
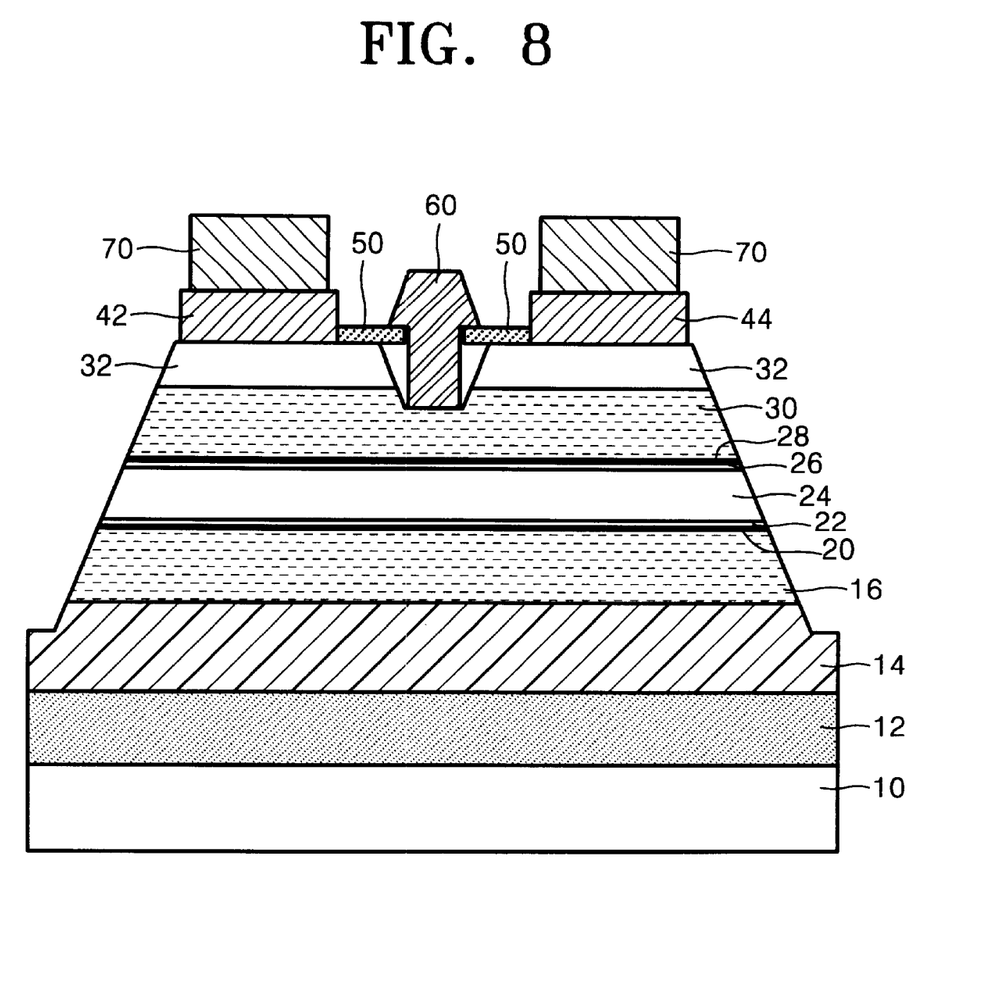

Referring to FIG. 8, an Au-plated layer 70 is formed on each of the source electrode 42 and the drain electrode 44 and connected to respective source pad and drain pad, thereby resulting in a PHEMT power device according to the present invention.

The results of a variety of characteristic measurements for the PHEMT power device according to the present invention will be described below. Power devices having a 0.5-$\mu$m-gate length, a 150-$\mu$m-unit gate width, and a 1.5-mm-total gate width were manufactured and used for the characteristic measurements.

Figure 9:
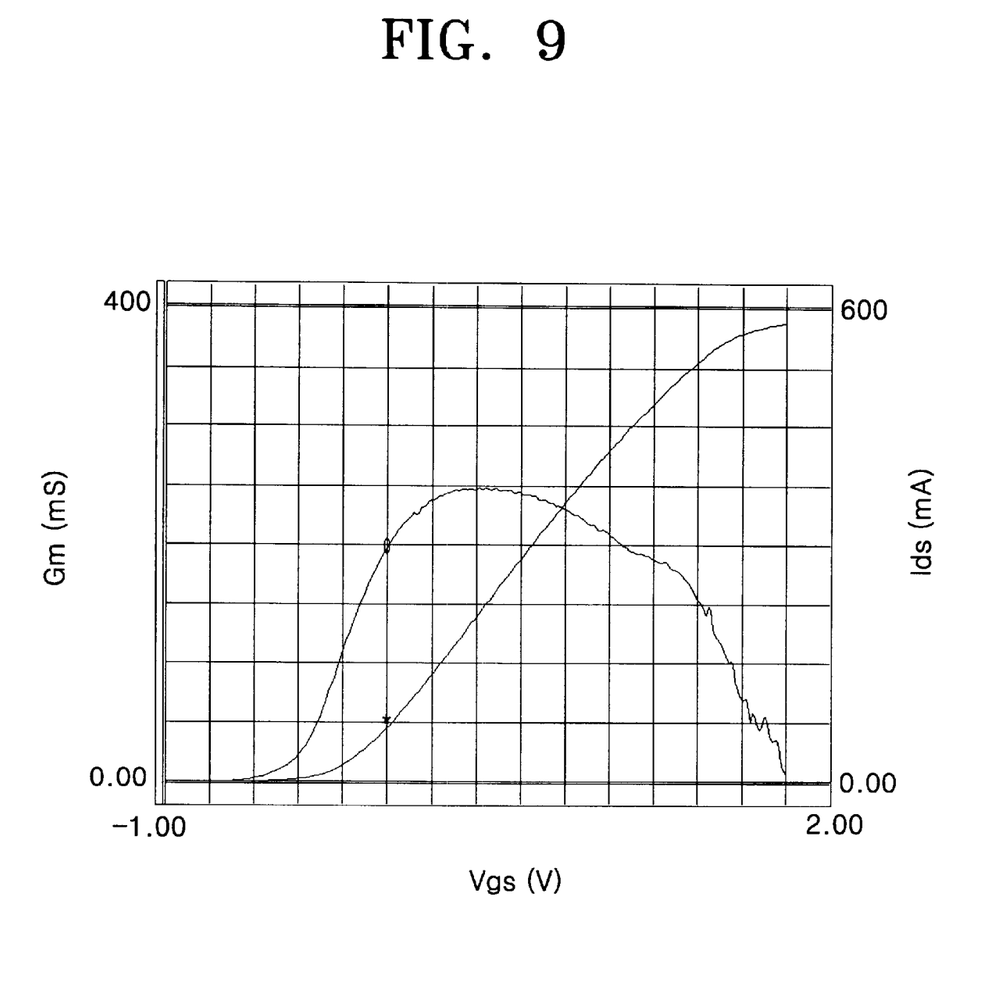
FIG. 9 is a graph showing the transconductance characteristic of the PHEMT power device according to the present invention.

FIG. 9 is a graph showing the transconductance and saturation current values of the PHEMT power device according to the present invention. As is apparent from FIG. 9, the PHEMT power device according to the present invention has a pinch-off voltage Vp of approximately −0.5V. The saturation current Ids is about 70 mA at a gate voltage of 0V. The maximum saturation current Imax is about 500 mA at a gate voltage of 1.2V. In considering common class AB amplifiers operating with a 15–20% voltage of the maximum saturation current, an operating gate voltage level applied to a gate input can be set to be no less than 0V. Evidently, the PHEMT power device can be operated with a single voltage supply, without need to apply a negative bias voltage. In addition, the transconductance Gm is nearly consistent in the range of 200–250 mS/mm at a gate voltage ranging from 0 to 1.1V. As a result, the PHEMT power device exhibits improved linearity.

Figure 10:
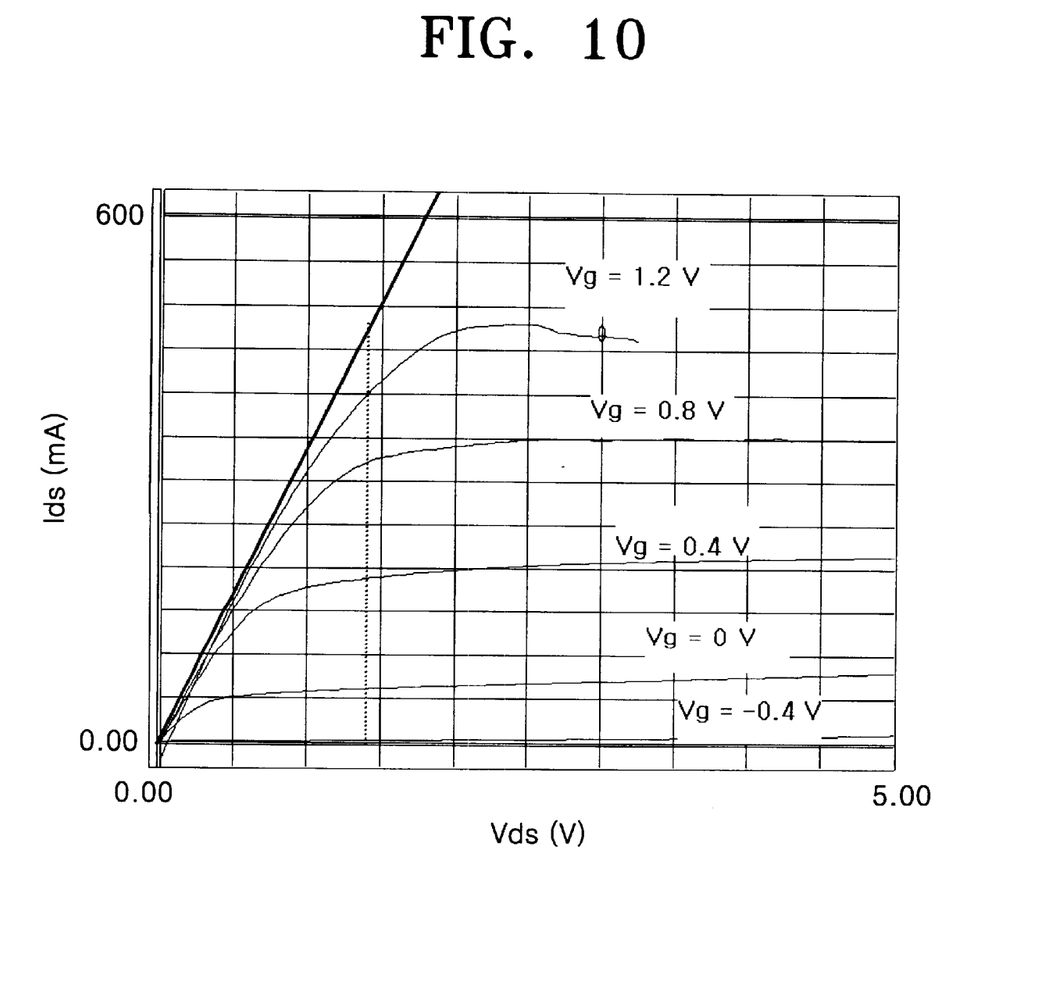
FIG. 10 is a graph showing the current-voltage characteristics of the PHEMT power device according to the present invention.

FIG. 10 is a graph showing the current-voltage characteristics of the PHEMT power device according to the present invention. As shown in FIG. 10, the knee voltage Vk of the PHEMT power device according to the present invention is as low as 1.4V at the maximum saturation voltage Imax. This result explains that the ohmic contact resistance can be maintained low even when the epitaxial substrate includes the undoped GaAs cap layer.

Figure 11:
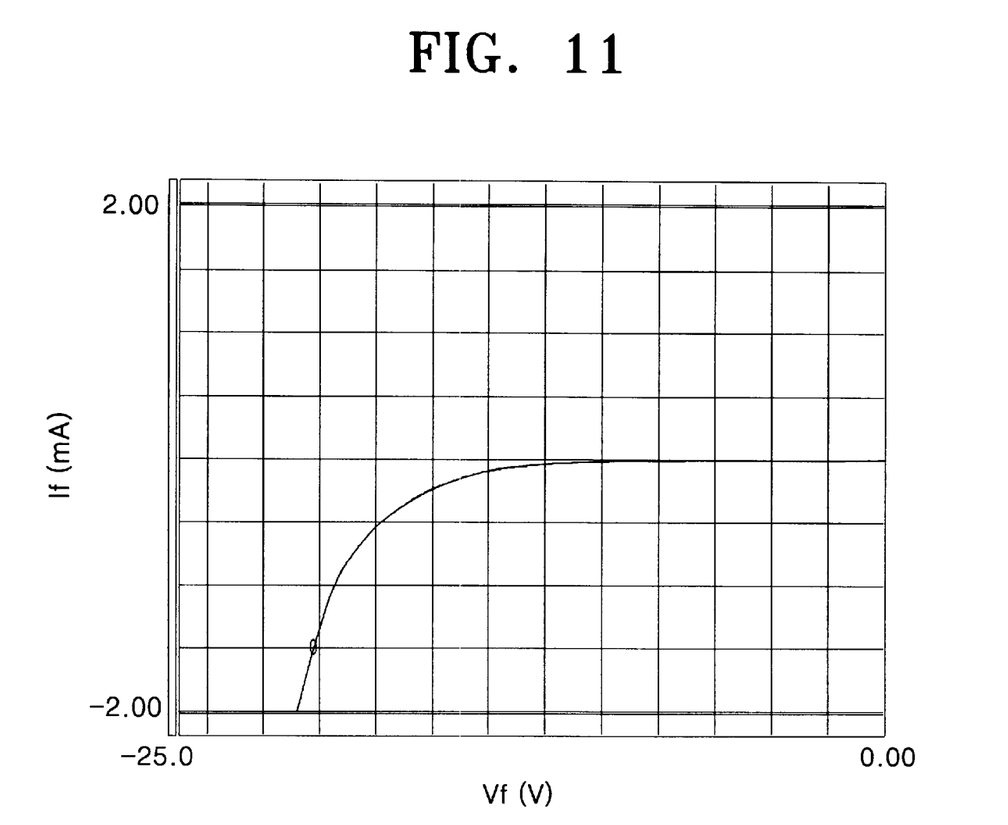
FIG. 11 is a graph showing the breakdown voltage characteristic of the PHEMT power device according to the present invention.

FIG. 11 is a graph showing the breakdown voltage characteristics of the PHEMT power device according to the present invention. In FIG. 11, the breakdown voltage Vbd appears as high as 20V. This is considered as the current leakage along the device surface is decreased by using the undoped GaAs cap layer in the PHEMT power device.

Figure 12:
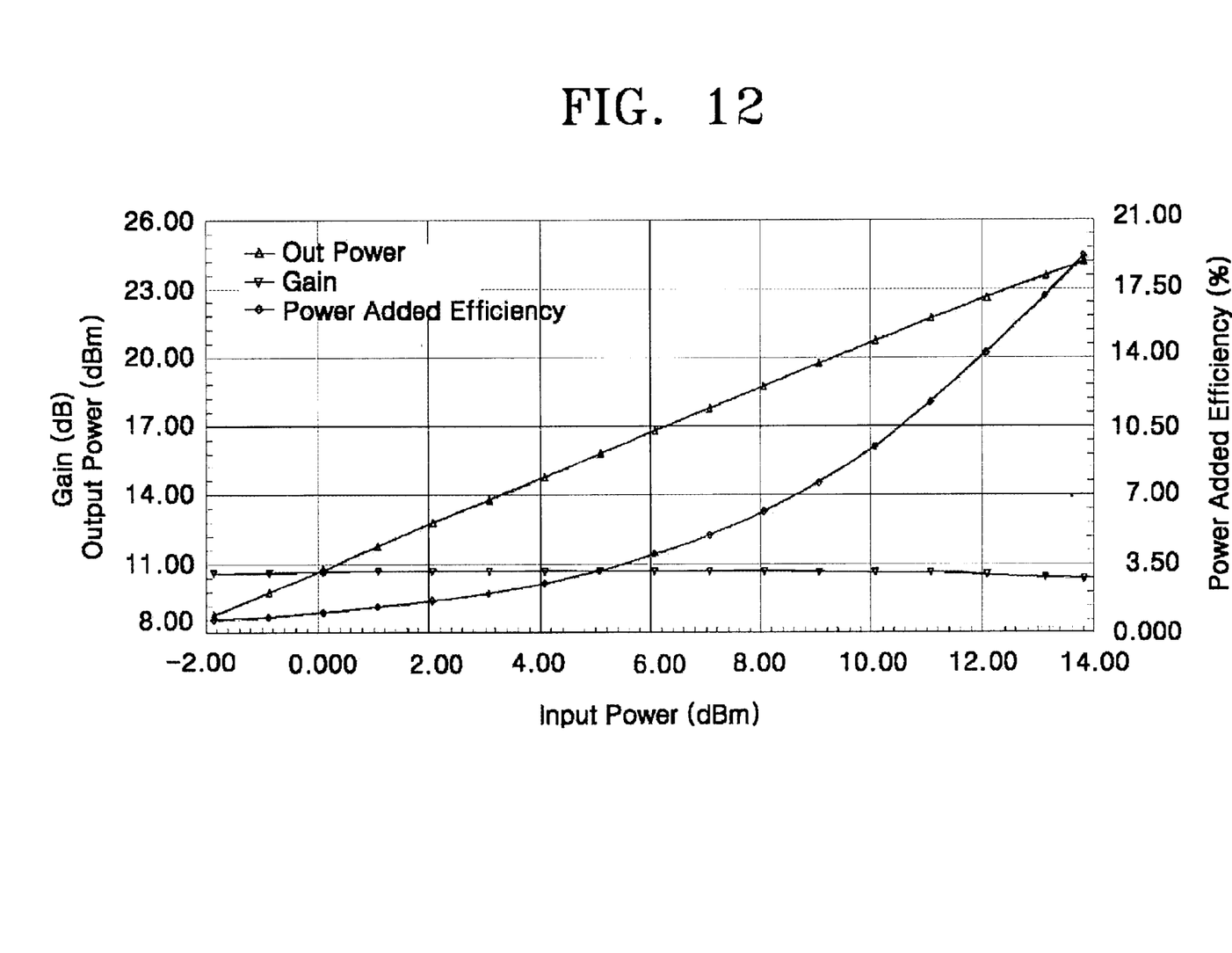
FIG. 12 is a graph showing the power characteristics of the PHEMT power device according to the present invention.

FIG. 12 is a graph showing the power characteristics of the PHEMT power device according to the present invention. These power characteristics were determined by a load-pull method at an input power of −2 to 14 dBm at a frequency of 5.75 GHz. As shown in FIG. 12, the power gain is constant at 10 dB with respect to different input powers. This is considered as the PHEMT power device according to the present invention manufactured is manufactured under optimised processing conditions to have the epitaxial structure capable of improving linearity and thus has a constant transconductance.

In the PHEMT power device according to the present invention with the double planar doped epitaxial substrate, the lower first doped silicon layer has a higher doping concentration than the upper second doped silicon layer so that the transconductance of the PHEMT power device is invariant with respect to gate voltages. In addition, the lightly doped AlGaAs layer present in the epitaxial substrate ensures etching uniformity in wet recess etching performed to manufacture the PHEMT power device according to the present invention. The overall manufacturing process for the PHEMT power device according to the present invention is easy and thus improves the productivity. The epitaxial substrate of the PHEMT power device includes the undoped GaAs cap layer formed in contact with the source electrode and the drain electrode to lower the contact resistance and thus to improve voltage characteristics while maintaining a low knee voltage. The PHEMT power device according to the present invention can maintain the transconductance constant irrespective of gate voltages with the optimized epitaxial substrate structure, i.e., the optimal doping concentration and thickness of the donor layer. The use of the undoped GaAs cap layer and the optimized processing conditions enable the resulting PHEMT power device to operate with a single voltage source, without need to apply a negative bias voltage, and to have a high breakdown voltage and excellent linearity and power-added efficiency.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A pseudomorphic high electron mobility transistor (PHEMT) power device comprising:

an epitaxial substrate including a GaAs buffer layer, an AlGaAs/GaAs superlattice layer, an updoped AlGaAs layer, a first doped silicon layer, a first spacer, an InGaAs electron transit layer, a second doped silicon layer having a different doping concentration from the first doped silicon layer, a lightly doped AlGaAs layer, and an undoped GaAs cap layer stacked sequentially on a semi-insulating GaAs substrate;

a source electrode and a drain electrode formed on and in ohmic contact with the undoped GaAs cap layer; and a gate electrode formed on the lightly doped AlGaAs layer to extend through the undoped GaAs cap layer.

2. The pseudomorphic high electron mobility transistor power device of claim 1, wherein each of the source electrode and the drain electrodes is formed of a AuGe/Ni/Au metal thin films.

3. The pseudomorphic high electron mobility transistor power device of claim 1, wherein the first doped silicon layer has a higher doping concentration than the second doped silicon layer.

4. The pseudomorphic high electron mobility transistor power device of claim 1, wherein the first doped silicon layer has a doping concentration of $1.5 \times 10^{12} \times 2.5 - 10^{12} \text{cm}^{-2}$, and the second doped silicon layer has a doping concentration of $0.7 \times 10^{12} - 1.5 \times 10^{12} \text{cm}^{-2}$.

5. The pseudomorphic high electron mobility transistor power device of claim 4, wherein the doping concentration of the first doped silicon layer is twice that of the second doped silicon layer.

6. The pseudomorphic high electron mobility transistor power device of claim 1, wherein the undoped AlGaAs layer contains aluminum of 0.3 or less by mole ratio.

7. The pseudomorphic high electron mobility transistor power device of claim 1, wherein the lightly doped AlGaAs layer has a doping concentration of $1.0 \times 10^{16} - 1.0 \times 10^{17} \text{cm}^{-3}$.

8. The pseudomorphic high electron mobility transistor power device of claim 1, wherein the undoped GaAs cap layer has a thickness of 1–100 nm.

9. The pseudomorphic high electron mobility transistor power device of claim 1, wherein the InGaAs electron transit layer contains indium of 0.25 or less by mole ratio.

10. The pseudomorphic high electron mobility transistor power device of claim 1, wherein the InGaAs electron transit layer has a thickness of 1–15 nm.

11. The pseudomorphic high electron mobility transistor power device of claim 1, further comprising a protective insulating layer formed on a portion of the undoped GaAs cap layer exposed by the source electrode, the drain electrode, and the gate electrode.

12. The pseudomorphic high electron mobility transistor power device of claim 11, wherein the protective insulating layer is formed of a silicon nitride layer.

* * * * *